(12) United States Patent
Cheng et al.

(10) Patent No.: US 10,381,536 B2
(45) Date of Patent: Aug. 13, 2019

(54) LIGHT-EMITTING DEVICE AND MANUFACTURING METHOD THEREOF

(71) Applicant: EPISTAR CORPORATION, Hsinchu (TW)

(72) Inventors: Ching-Tai Cheng, Hsinchu (TW); Lung-Kuan Lai, Hsinchu (TW); Yih-Hua Renn, Hsinchu (TW); Min-Hsun Hsieh, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/699,598

(22) Filed: Sep. 8, 2017

(65) Prior Publication Data

US 2018/0076369 A1 Mar. 15, 2018

(30) Foreign Application Priority Data

Sep. 9, 2016 (TW) .............................. 105129262 A (51) Int. Cl.
*H01L 33/62* (2010.01)
*H01L 33/54* (2010.01)
*H01L 25/075* (2006.01)
*H01L 33/64* (2010.01)

(52) U.S. Cl.
CPC .......... *H01L 33/62* (2013.01); *H01L 25/0753* (2013.01); *H01L 33/54* (2013.01); *H01L 33/647* (2013.01); *H01L 2933/0033* (2013.01); *H01L 2933/0066* (2013.01)

(58) Field of Classification Search
CPC ..... H01L 33/62; H01L 25/0753; H01L 33/54; H01L 2933/0066; H01L 33/647; H01L 2933/0033
See application file for complete search history.

(56) References Cited

U.S. PATENT DOCUMENTS

| | | | |
|---|---|---|---|
| 7,736,945 B2* | 6/2010 | Schiaffino | H01L 33/0079 257/E21.503 |
| 2008/0006837 A1* | 1/2008 | Park | H01L 25/167 257/98 |
| 2008/0079015 A1* | 4/2008 | Krummacher | B82Y 20/00 257/98 |
| 2011/0095418 A1* | 4/2011 | Lim | H01L 23/3128 257/737 |
| 2011/0220931 A1 | 9/2011 | Kojima | |
| 2014/0151096 A1* | 6/2014 | Jiang | H01L 23/488 174/257 |

(Continued)

*Primary Examiner* — Su C Kim
(74) *Attorney, Agent, or Firm* — Ditthavong & Steiner, P.C.

(57) ABSTRACT

A light-emitting device includes a light-emitting element, a light pervious layer, an electrode defining layer, a first soldering pad and a second soldering pad. The light-emitting element has an upper surface, a bottom surface, and a lateral surface arranged between the upper surface and the bottom surface. The light pervious layer covers the upper surface and the lateral surface. The electrode defining layer covers a part of the light pervious layer. The first soldering pad and the second soldering pad are surrounded by the electrode defining layer. A gap is located between the first soldering pad and the second soldering pad while the gap remains substantially constant.

18 Claims, 5 Drawing Sheets

(56) References Cited

U.S. PATENT DOCUMENTS

2015/0200335 A1* 7/2015 Bhat .................... H01L 33/486
                                                        257/88
2015/0349231 A1* 12/2015 Hsieh ................... H01L 33/642
                                                        257/98
2016/0190409 A1    6/2016 Kuo et al.

* cited by examiner

LIGHT-EMITTING DEVICE AND MANUFACTURING METHOD THEREOF

CROSS-REFERENCE TO RELATED APPLICATION

This application claims priority to and the benefit of TW Application Number 105129262 filed on Sep. 9, 2016, and the disclosure of which is incorporated by reference in its entirety.

BACKGROUND

Technical Field

The present disclosure relates to a light-emitting device and manufacturing method thereof, and in particular to a light-emitting device having a wavelength converting layer and a light-adjusting layer.

Description of the Related Art

In the solid light emitting elements, light-emitting diodes (LEDs) have characteristics such as low power consumption, low heat generation, long operational life, shockproof, small volume, and quick response. Therefore, light-emitting diodes have been adopted widely in various fields, for instance, vehicles, home appliances, and lighting lamps.

The light-emitting element is one component in the light-emitting device as a light source. Electrodes in the light-emitting device are the main structure to electrically connect to the external power. Moreover, if the light-emitting element is arranged in the light-emitting device in the form of flip chip, the electrodes are also able to enhance heat dispersing.

SUMMARY OF THE DISCLOSURE

An embodiment of the application discloses a light-emitting device. The light-emitting device includes a light-emitting element, a light pervious layer, an electrode defining layer, a first soldering pad and a second soldering pad. The light-emitting element has an upper surface, a bottom surface, and a lateral surface arranged between the upper surface and the bottom surface. The light pervious layer covers the upper surface and the lateral surface. The electrode defining layer covers a part of the light pervious layer. The first soldering pad and the second soldering pad are surrounded by the electrode defining layer. A gap is located between the first soldering pad and the second soldering pad while the gap remains substantially constant.

DETAILED DESCRIPTION OF THE EMBODIMENTS

To better and concisely explain the disclosure, the same name or the same reference numerals given or appeared in different paragraphs or figures along the specification should has the same or equivalent meanings while it is once defined anywhere of the disclosure. In addition, these drawings are not necessarily drawn to scale. Likewise, the relative sizes of elements illustrated by the drawings may differ from the relative sizes depicted.

The following shows the description of embodiments of the present disclosure in accompany with the drawings.

Figure 1A:
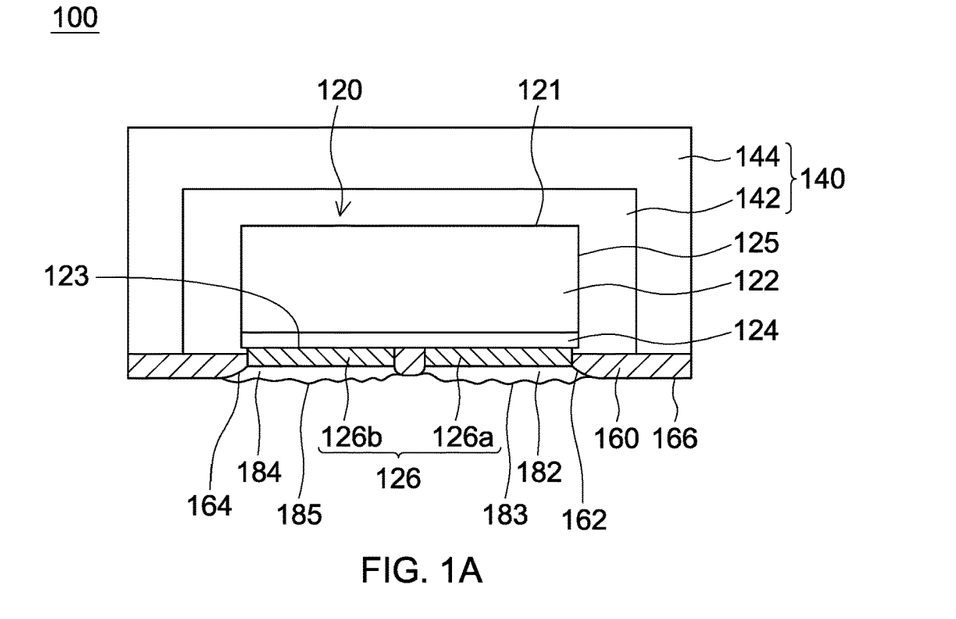
FIG. 1A is a cross sectional view of a light-emitting device in accordance with one embodiment of the present disclosure.

FIG. 1A is a cross-sectional view of a light-emitting device 100 in accordance with one embodiment of the present disclosure. The light-emitting device 100 includes a light-emitting element 120, a light pervious layer 140, an electrode defining layer 160, and a first soldering pad 182 and a second soldering pad 184. The light pervious layer 140 covers a part of surfaces of the light-emitting element 120. The electrode defining layer 160 is formed on bottom surfaces of the light-emitting element 120 and the light pervious layer 140 and has a plurality of recess structures 162, 164. In one embodiment, the electrode defining layer 160 directly contacts a part of a bottom surface 123 in the light-emitting element 120 and a bottom surface of the light pervious layer 140. Moreover, the first soldering pad and the second soldering pad 182, 184 are filled into the recess structures 162, 164, respectively.

In an embodiment, as FIG. 1A shows, the light-emitting element 120 includes a supporting substrate 122, a light-emitting layer 124, and conductive pads 126. Moreover, a side of the light-emitting layer 124 faces the supporting substrate 122 and another side faces the conductive pads 126. Furthermore, the light-emitting element 120 includes an upper surface 121, a bottom surface 123, and a plurality of lateral surfaces 125 which is located between the upper surface 121 and the bottom surface 123. The bottom surface 123 of the light-emitting element 120 refers to a surface of the light-emitting layer 124 remote from the supporting substrate 122. The supporting substrate 122 can hold or support the light-emitting layer 124. In one embodiment, the supporting substrate 122 is a growth substrate, such as sapphire, for light-emitting structure 124 being epitaxially grown on. In another embodiment, the supporting substrate 122 is not the growth substrate and is connected to the light-emitting layer 124 by bonding methods, such as metal bonding, adhesive bonding, or direct bonding. The supporting substrate 122 can be a structure replacing the growth substrate (and the growth substrate is removed) or formed on the growth substrate. The supporting substrate 122 can also include or be an optical structure or material so as to guide light from the light-emitting layer 124 to a specific direction or to form a specific light field or color. The lateral surfaces 125 include a side surface of the supporting substrate 122 and that of the light-emitting layer 124.

In an embodiment, the light-emitting layer 124 includes a first semiconductor layer, an active region and a second semiconductor layer (not shown). In an embodiment, the first semiconductor layer can be an n-type semiconductor layer as a first cladding layer, and the second semiconductor layer can be a p-type semiconductor layer as a second cladding layer. The first cladding layer and the second cladding layer can confine electrons or holes within the active region. The active region can include single heterostructure, double heterostructure or multi-quantum well (MQW). The multi-quantum well is alternately arranged by well layers and barrier layers. A well layer and a barrier layer are a group. The multi-quantum well can be one group or multiple groups. In an embodiment, the conductive pads 126 include two conductive pads 126a and 126b disposed on the same side of the light-emitting element 120. The conductive pads 126a and 126b are electrically connected to the first semiconductor layer and the second semiconductor layer through different paths, respectively. Moreover, conductive pads 126a and 126b can be both extended to an elevation higher than a bottom surface of the light pervious layer 140 (as the figure shows), to an elevation close to the bottom surface (not shown) or only one contact extended to an elevation higher than the bottom surface (not shown). The conductive pads 126a and 126b can be coplanar (as the figure shows) or not coplanar (not shown). The conductive pads 126a and 126b can be an interface between the light-emitting element 120 and the first soldering pad and the second soldering pad 182, 184. In practice, the conductive pads 126a and 126b need to have good bonding strength with the first soldering pad and the second soldering pad 182, 184. In one embodiment, material of the conductive pads 126a and 126b includes gold or gold/tin alloys.

The light-emitting element 120 can be an LED die, including but not limit to blue LED die or UV LED die. In one embodiment, the light-emitting element 120 is a blue LED die which can emit a first light by a power source providing power while the first light has a dominant wavelength or a peak wavelength in the range of 430 nm and 490 nm. In another embodiment, the light-emitting element 120 is violet LED die which can emit a first light by a power source providing power while the first light has a dominant wavelength or a peak wavelength in the range of 400 nm and 430 nm.

In one embodiment, the light pervious layer 140 can include a wavelength conversion layer 142 and a light-adjusting layer 144. The wavelength conversion layer 142 covers the light-emitting element 120, and the light-adjusting layer 144 covers the wavelength conversion layer 142. In another embodiment, the wavelength conversion layer 142 and the light-adjusting layer 144 are not two layers but a single layer (not shown) that can provide wavelength converting and light adjusting. In one embodiment, the wavelength conversion layer 142 can include a transparent binder (not shown) and a plurality of wavelength conversion particles (not shown) dispersed within the transparent binder. The wavelength conversion particles can absorb a part or all first light from the light-emitting element 120 to convert to a second light with different wavelength or spectrum from the first light. The color emitted from the second light can be green, yellowish green, yellow, amber, reddish orange or red. The wavelength conversion layer 142 can include single or different kinds of wavelength conversion particles. In one embodiment, the wavelength conversion layer contains the wavelength conversion particles capable of emitting yellow light. In another embodiment, the wavelength conversion layer 142 has wavelength conversion particles capable of emitting green light and red light.

The wavelength conversion layer 142 can cover one or more light extracting surfaces of the light-emitting element 120. In one embodiment, the light extracting surfaces of the light-emitting element 120 include a top surface 121 and lateral surfaces 125 and the wavelength conversion layer 140 covers the top surface 121 and the lateral surfaces 125. In one embodiment, the wavelength conversion layer 140 directly contacts the top surface 121 and the lateral surfaces 125 of the light-emitting element 120.

The light-adjusting layer 144 is formed on the light-emitting element 120 and the wavelength conversion layer 142, so as to remix the mixed light from the light-emitting element 120 and the wavelength conversion layer 142 to form the mixed light with a more uniform color distribution. In one embodiment, the light-adjusting layer 144 includes a binder (not shown) and a plurality of light-diffusing particles (not shown) dispersed within the binder.

Figure 1B:
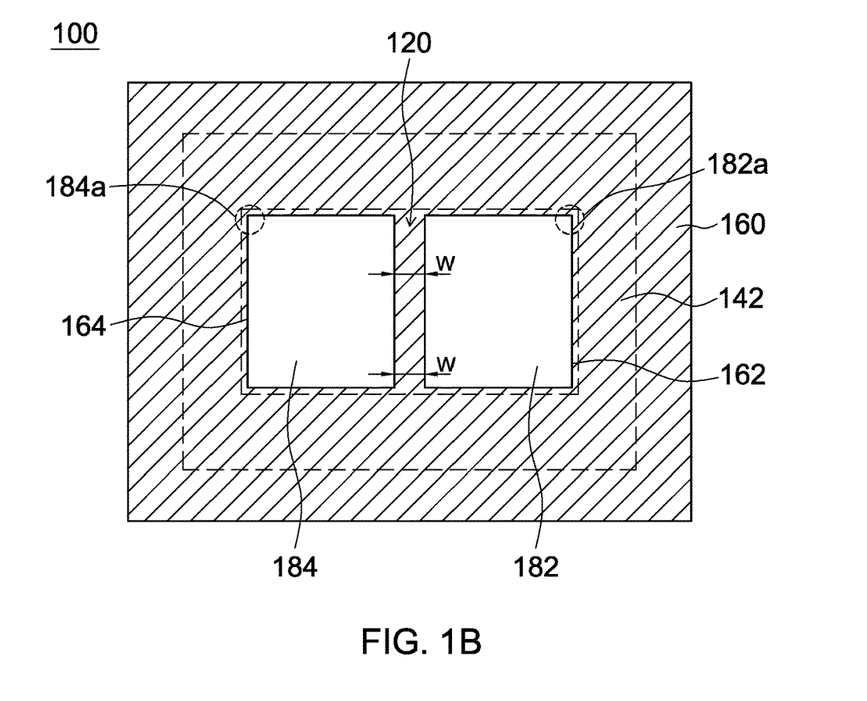
FIG. 1B is a bottom view of the light-emitting device shown in FIG. 1A.

The electrode defining layer 160 is formed on the bottom surfaces of the light-emitting element and the light pervious layer 140. In one embodiment, the electrode defining layer 160 directly contacts the light-emitting element 120 (as the figure shows). In another embodiment, the electrode defining layer 160 does not directly contact the light-emitting element 120 (not shown). The electrode defining layer 160 exposes conductive pads 126a and 126b by forming a plurality of recesses 162 and 164. FIG. 1B shows a bottom view of the light-emitting device 100 in FIG. 1A. In one embodiment, referring to FIG. 1B, shapes of the recesses 162 and 164 are both rectangular. The electrode defining layer 160 can define or anchor the position or shape of solder for the first soldering pad and the second soldering pad 182, 184 and prevent solder from contacting other area that is not defined. Moreover, the electrode defining layer 160 can also reflect the light emitted from the light-emitting device 100 so light extraction of the light-emitting device 100 can be increased. In one embodiment, the electrode defining layer 160 includes a transparent binder and light-reflecting particles dispersed in the transparent binder. Material of the transparent binder can be silicone or epoxy. Material of the light-reflecting particles can be titanium oxide, alumina, or zinc oxide.

The first soldering pad 182 and the second soldering pad 184 are respectively filled into the recesses 162, 164. The shapes of the first soldering pad 182 and the second soldering pad 184 are defined by the recesses 162, 164. In one embodiment, the shapes of the first soldering pad 182, the second soldering pad 184 and the recesses 162, 164 are similar or the same wherein the shape can be a polygon having multiple sides. Any two neighboring sides form a corner in-between, such as corners 182a and 184a. The number of the corners in the first soldering pad 182 can be the same or different from that in the second soldering pad 184. For instance, the number of the corners in the first soldering pad 182 is the same as that in the second soldering pad 184. In another embodiment, the difference of the numbers of the corners in the first soldering pad 182 and that of the second soldering pad 184 is n, wherein n is an integer greater than or equal to 1. The shape of the soldering pad can be triangular, rectangular, pentagonal, or hexagonal. In another embodiment, the first soldering pad 182 is triangular and the second soldering pad 184 is rectangular. The different shape of the first soldering pad 182 from that of the second soldering pad 184 can help to identify the positive and negative electrodes in the light-emitting device 100. The soldering pads and the recesses are located on the same elevation (referring to FIG. 1A). Moreover, a side of the first soldering pad 182 is substantially parallel to a side of the second soldering pad 184 so a gap W between the first soldering pad 182 and the second soldering pad 184 remains a constant. In one embodiment, the gap is not greater than 40

μm. In another embodiment, the gap is not greater than 20 μm. The greater the projected areas of the first soldering pad 182 and the second soldering pad 184 are, the lower the thermal contact resistance of the light-emitting device 100 is so the heat dissipation is improved. The projected area herein is referred to areas of the elements in the light-emitting device projected on the bottom view of the light-emitting device. In one embodiment, a ratio of the projected area of the first soldering pad 182 to a projected area of the conductive pad 126*a* is not less than 0.9, and a ratio of the projected area of the second soldering pad 184 to that of the conductive pad 126*b* is also not less than 0.9. In another embodiment, a ratio of the projected area of the first soldering pad 182 to that of the conductive pad 126*a* is ranged from 0.9 to 2.9.

The first soldering pad 182 includes a first surface 183 and the second soldering pad 184 includes a second surface 185. In one embodiment, the first surface 183 and the second surface 184 can be substantially flat or non-flat surface. The non-flat surface can be a concave and convex surface. In one embodiment, the height difference of the first surface 183 (or/and the second surface 185) and an outer surface 166 of the electrode defining layer 160 is not greater than 10 μm. The first soldering pad 182 (or/and the second soldering pad) is substantially coplanar with the electrode defining layer 160 so the light-emitting device 100 can be fixed more easily and keep a stable setting so the light-emitting direction is more precise.

The first soldering pad 182 can physically and electrically connect the conductive pad 126*a* and a wiring board (not shown). The second soldering pad 184 can physically and electrically connect the conductive pad 126*b* and the wiring board (not shown). The higher bonding strength between the first soldering pad 182, the second soldering pad 184 and conductive pads 126*a* and 126*b* is, the less possibility to have peeling problem. The materials of the first soldering pad 182 and the second soldering pad 184 can be conductive metal having lower melting point. In one embodiment, the melting temperature (or liquefaction point) of material in the first soldering pad 182 and the second soldering pad 184 is not higher than 280° C. In another embodiment, the materials of the first soldering pad 182 and the second soldering pad 184 include pure tin or tin alloy. The tin alloy includes Sn/Ag alloy, Sn/Ag/Cu alloy, Sn/Cu alloy, Sn/Pb alloy or Sn/Sb alloy. The first soldering pad 182 and the second soldering pad 184 can be single layer or multi-layer. In one embodiment, the structure of the first soldering pad 182 or the second soldering pad 184 is single layer, and the material thereof is tin alloy. In another embodiment, the first soldering pad 182 is a multi-layer structure and the second soldering pad 184 is also a multi-layer structure while the metal close to or directly contacting the conductive pads 126*a* and 126*b* has a higher melting point and the metal farther or not directly contacting the conductive pads 126*a* and 126*b* has a lower melting point. In one embodiment, the metal of the higher melting point is Sn/Sb alloy (first tin alloy) and the metal of the lower melting point is Sn/Ag/Cu alloy (second tin alloy). In another embodiment, the metal of the higher melting point is Cu and the metal of the lower melting point is tin alloy (including but not limited to Sn/Sb alloy and Sn/Ag/Cu alloy).

Figure 2A:
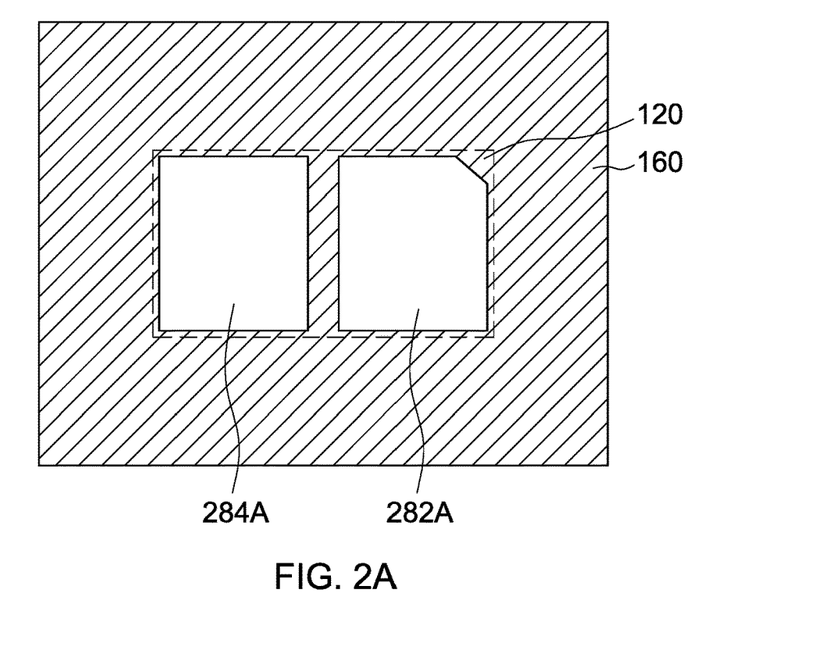
FIG. 2A is a bottom view of the light-emitting device in accordance with another embodiment of the present disclosure.
Figure 2B:
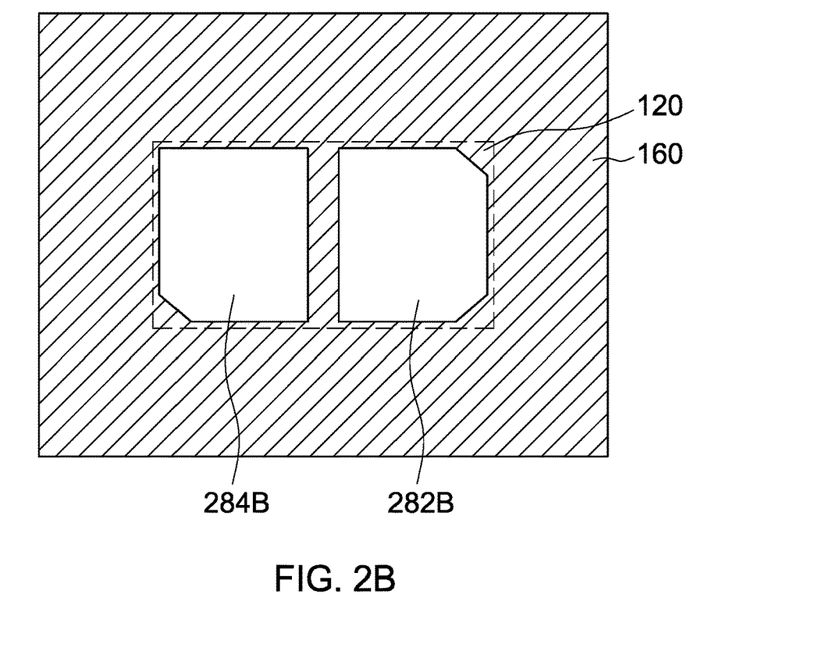
FIG. 2B is a bottom view of the light-emitting device in accordance with another embodiment of the present disclosure.

FIG. 2A shows a bottom view of the light-emitting device 100 in FIG. 1A. The shape of a first soldering pad 282A is different from that of a second soldering pad 284A so as to help to identify the positions of the positive electrode and the negative electrode while fixing the light-emitting device 100. In one embodiment, the first soldering pad 282A is a pentagonal structure with one bevel edge and the second soldering pad 284A is a rectangular structure. FIG. 2B shows a bottom view of the light-emitting device 100 in FIG. 1A. The shape of a first soldering pad 282B is also different from that of a second soldering pad 284B. The first soldering pad 282B is a hexagonal structure with two bevel edges and the second soldering pad 284B is a pentagonal structure with one bevel edge.

Figure 3A:
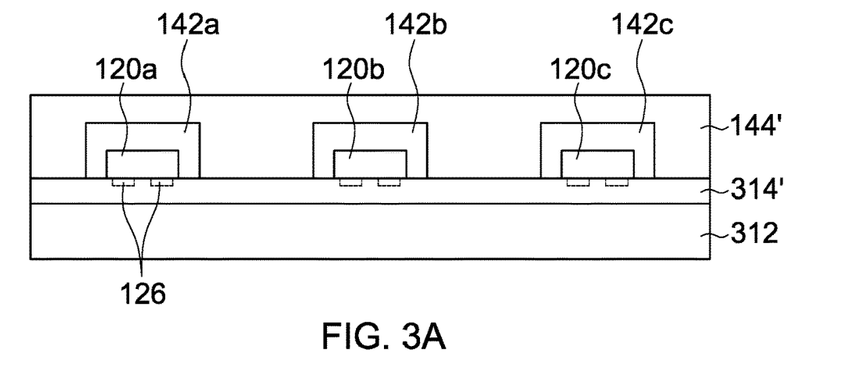
FIGS. 3A~3F illustrate a manufacturing flow of the light-emitting device in accordance with one embodiment of the present disclosure.

FIGS. 3A~3F illustrate a manufacturing flow of the light-emitting device 100 in accordance with one embodiment of the present disclosure. Referring to FIG. 3A, a temporary carrier 312, light-emitting elements 120*a*, 120*b*, 120*c*, and an adhesive layer 314' for fixing the light-emitting elements 120*a*, 120*b*, 120*c* on the temporary carrier 312 are provided. The number of the light-emitting elements is an example but not limited to three. In one embodiment, the temporary carrier 312 can be glass, sapphire substrate, metal plate or plastic plate. Furthermore, a surface facing the light-emitting elements 120*a*, 120*b*, 120*c* of the temporary carrier 312 has a planar surface. The adhesive layer 314' can be UV curing adhesive. When the adhesive layer 314' is not fully cured, the adhesive layer 314' stays sticky.

Referring to FIG. 3A again, a plurality of wavelength conversion layers 142*a*, 142*b*, 142*c* is formed on the adhesive layer 314' and covers the light-emitting elements 120*a*, 120*b*, 120*c*. In one embodiment, the wavelength conversion layers 142*a*, 142*b*, 142*c*' are pre-formed as a sheet structure (wavelength conversion sheet) which mixes wavelength conversion particles and the transparent adhesive. The size of the sheet structure can be adjusted based on the needs. For example, the wavelength conversion sheet can cover the light-emitting elements as a batch or individually. That is to say, one wavelength conversion sheet covers only one or few light-emitting elements. In an embodiment, the wavelength conversion sheet is laminated on the top of the light-emitting elements 120*a*, 120*b*, 120*c*. The lamination is made by tightly sealing an upper mold (the wavelength conversion sheet can be disposed on the upper mold) and a lower mold (the light-emitting element can be disposed on the lower mold), and heating and giving the pressure to the wavelength conversion sheet 240' at the same time so as to soften the wavelength conversion sheet 240' for connecting to the light-emitting elements 120*a*, 120*b*, 120*c* tightly. At this stage, the wavelength conversion sheet is not cured completely but is fully cured by heating in subsequent processes. In an embodiment, after removing a part of the wavelength conversion sheet, a plurality of trenches is formed and the wavelength conversion sheet is divided to a plurality of wavelength conversion layers 142*a*, 142*b*, 142*c*. Therefore, the light-adjusting layer 144' can be filled into the trenches and cover the lateral wall of the wavelength conversion layers 142*a*, 142*b*, 142*c*. In another embodiment, before being arranged on the light-emitting elements 120*a*, 120*b*, 120*c*, the wavelength conversion layers 142*a*, 142*b*, 142*c* is not sheet structures but glue. The glue form is directly coated and covered on the light-emitting elements 120*a*, 120*b*, 120*c* by dispensing. And then the glue is cured by heating, and a portion of the cured glue is removed to form the wavelength conversion layers 142*a*, 142*b*, 142*c*.

Referring to FIG. 3A again, a light-adjusting layer 144' is formed on the light-emitting elements 120*a*, 120*b*, 120*c* and the wavelength conversion layer 142*a*, 142*b*, 142*c*. In one embodiment, the light-adjusting layer 144' is pre-formed as a sheet structure (light-adjusting sheet) which mixes diffusing particles and the adhesive layer. The procedure of applying the light-adjusting sheet is similar to the wavelength conversion sheet, but the light-adjusting layer 144' is not divided to a plurality of the light-adjusting layers after curing.

Figure 3B:
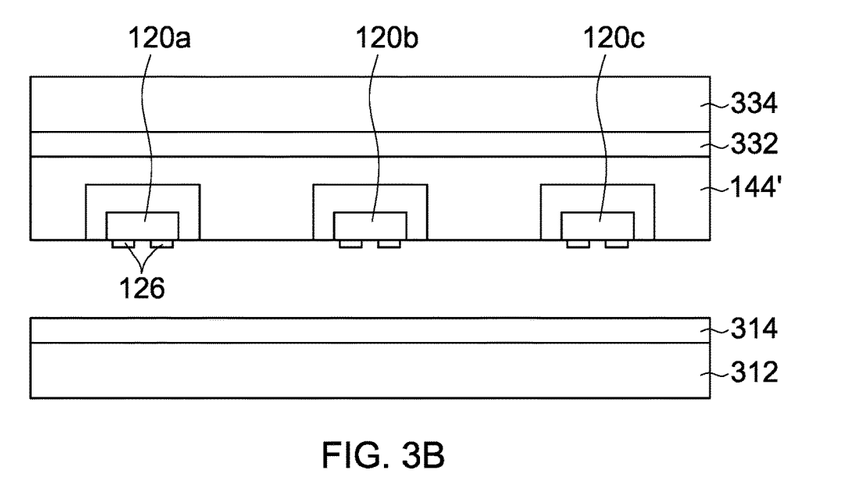

Referring to FIG. 3B, the structure disclosed in FIG. 3A is laminated to another temporary carrier 334 with an adhesive layer 332. Therefore, the light-adjusting layer 144' is adhered to the adhesive layer 332. Moreover, the temporary carrier 312 is separated from the light-emitting elements 120a, 120b, 120c and the light-adjusting layer 144'. At this stage, the light-emitting element 120a exposes two conductive pads 126, the light-emitting element 120b exposes two conductive pads 126, and the light-emitting element 120c also exposes two conductive pads 126.

Figure 3C:
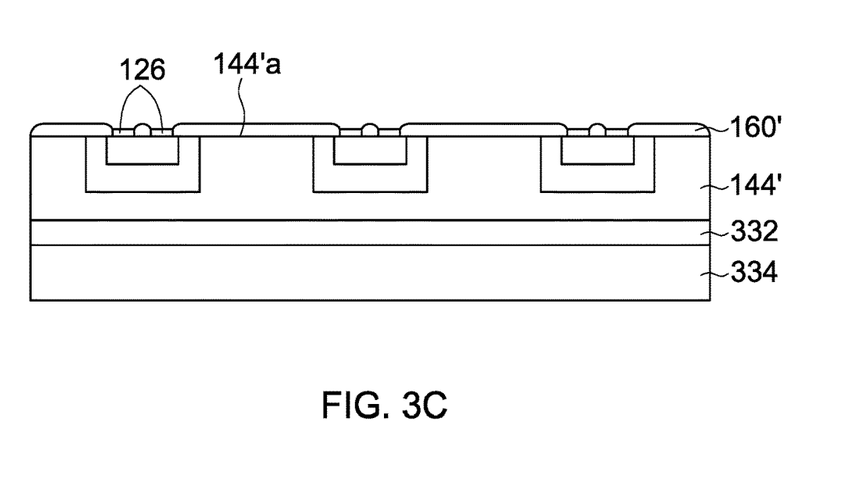

Referring to 3C, the electrode defining layer 160' is formed on the surroundings of the conductive pads 126 of the light-emitting elements 120a, 120b, 120c. The electrode defining layer 160' can be protruded from the conductive pads 126. Furthermore, the electrode defining layer 160' can cover a part of or the whole surface 144'a of the light-adjusting layer 144'. The electrode defining layer 160' can be formed by screen printing or processes of exposure and development, and the electrode defining layer forms recesses to expose the conductive pads 126.

Figure 3D:
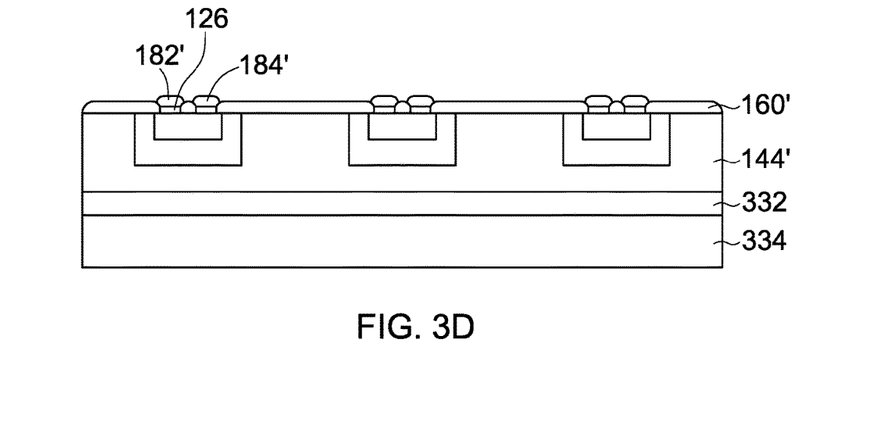

Referring to FIG. 3D, solders 182' and 184' are formed on the conductive pads 126. Moreover, the solders 182' and 184' are higher than (protruding) the electrode defining layer 160'. In one embodiment, the electrode defining layer 160' is dipped in the melting solders 182' and 184' in the structure disclosed in FIG. 3C so the solders 182' and 184' can be attached to the conductive pads 126 and filled in the recesses defined by the electrode defining layer 160'. Therefore, the shapes of the solders 182' and 184' are defined by the shape of the recesses.

Figure 3E:
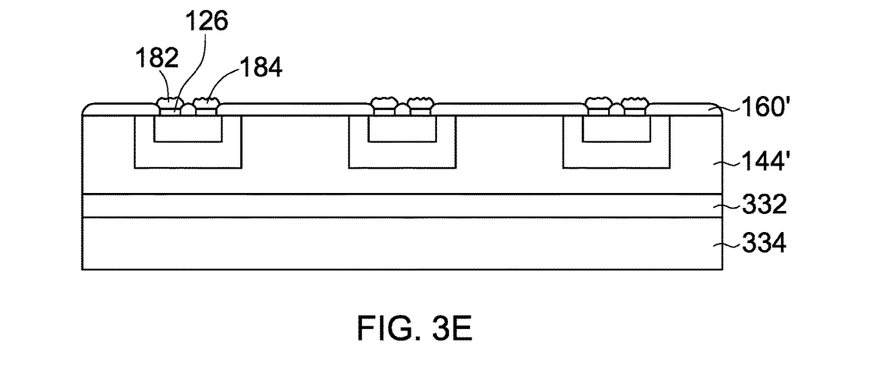

Referring to FIG. 3E, the solders on the conductive pads are leveled to form the first soldering pad 182 and the second soldering pad 184. In one embodiment, the extra solder can be removed by heat wind flowing the protruded surface so the first soldering pad 182 and the second soldering pad 184 can be coplanar with the outermost surface of the electrode defining layer 160'.

Figure 3F:
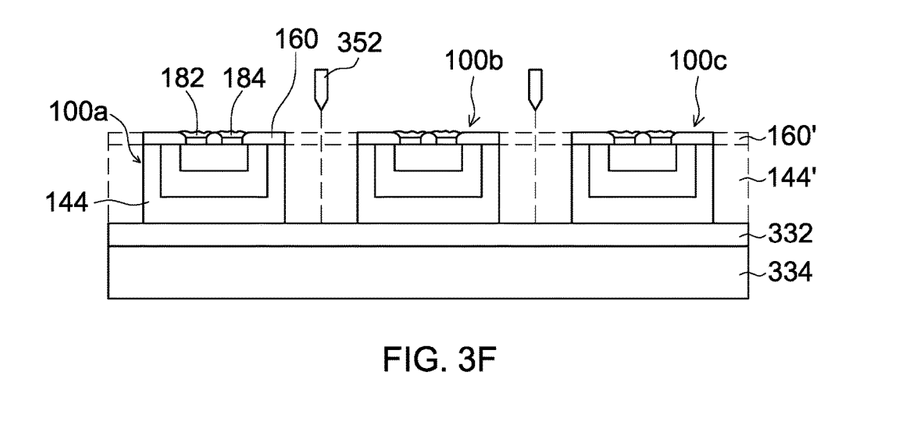

Referring to FIG. 3F, the electrode defining layer 160' and the light-adjusting layer 144' are divided. At this stage, the first soldering pad 182 and the second soldering pad 184 face the upward direction. Furthermore, in one embodiment, when the electrode defining layer 160' and the light-adjusting layer 144' are divided by cutting, the cut surface exposes the electrode defining layer 160' and the light-adjusting layer 144'. A cutting tool 352, such as a blade, cuts the electrode defining layer 160' and the light-adjusting layer 144' from top to bottom so as to form light-emitting devices 100a, 100b and 100c. In another embodiment, the electrode defining layer 160' is cut by the first cutting tool and then the light-adjusting layer 144' is cut by the second cutting tool.

Figure 4:
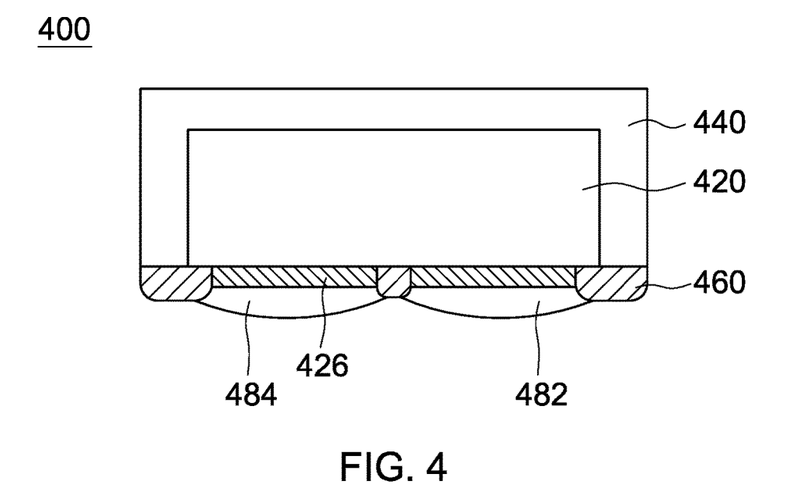
FIG. 4 is a cross-sectional view of a light-emitting device in accordance with another embodiment of the present disclosure.

FIG. 4 is a cross-sectional view of a light-emitting device 400 in accordance with another embodiment of the present disclosure. The light-emitting device 400 includes a light-emitting element 420, a light pervious layer 440, an electrode defining layer 460, and a first soldering pad and a second soldering pad 482, 484. The light-emitting element 420 includes a plurality of conductive pads 426. The first soldering pad 482 is formed on the conductive pad 426, and the second soldering pad 484 is formed on the other conductive pad 426. The structures, functions and making methods of the light-emitting element 420, the conductive pads 426, the light pervious layer 440 and the electrode defining layer 460 can be referred to the paragraphs related with FIG. 1. However, in FIG. 4, the first soldering pad 482 and the second soldering pad 484 are slightly protruding from the electrode defining layer 460. In one embodiment, the first soldering pad 482 and the second soldering pad 484 protrude from the electrode defining layer 460 and the height difference is not greater than 10 µm. The first soldering pad 482 and the second soldering pad 484 can be made by jet printing to spray the solder to a predetermined position beforehand. And then the first soldering pad 482 and the second soldering pad 484 are gone through reflow to form a slight protrusion.

Figure 5:
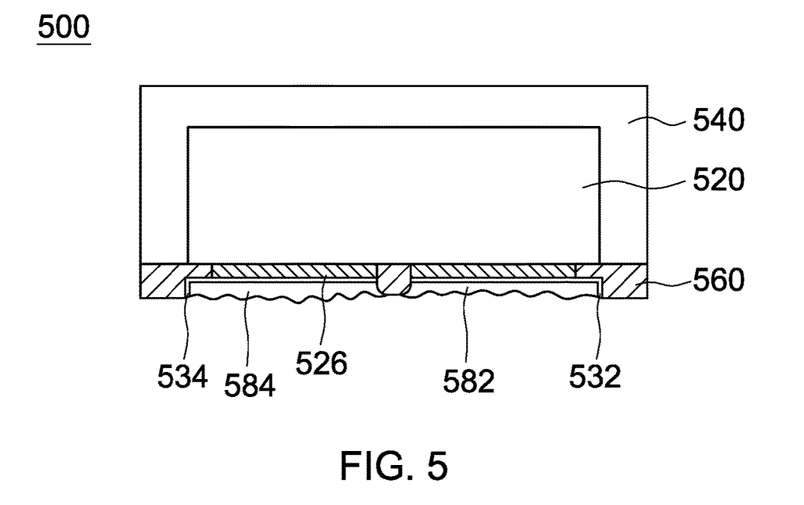
FIG. 5 is a cross-sectional view of a light-emitting device in accordance with another embodiment of the present disclosure.

FIG. 5 is a cross-sectional view of a light-emitting device 500 in accordance with another embodiment of the present disclosure. The light-emitting device 500 includes a light-emitting element 520, a light pervious layer 540, an electrode defining layer 560, and a first soldering pad and a second soldering pad 582, 584. The light-emitting element 520 includes a plurality of conductive pads 526. The first soldering pad 582 is formed on the conductive pads 526, and the second soldering pad 584 is formed on the conductive pad 526. The structures, functions and making methods of the light-emitting element 520, the conductive pads 526, the light pervious layer 540 and the electrode defining layer 560 can be referred to the paragraphs related with FIG. 1. However, in FIG. 5, the electrode defining layer 560 includes a step structure. Therefore, the area of the first soldering pad 582 and that of the second soldering pad 584 can be expanded outward from the light-emitting element 520 so as to enhance heat dissipating. In one embodiment, in order to improve bonding strength between the first soldering pad 582, the second soldering pad 584 and the electrode defining layer 560, thin metal layers 532, 534 are formed in the inner sides of the recesses in the electrode defining layer 560 and then the first soldering pad 582 and the second soldering pad 584 are formed on the thin metal layer 532, 534. The thin metal layers 532, 534 are formed by sputtering or electroless plating.

It is noted that the foregoing description has been directed to the specific embodiments of this invention. It will be apparent to those having ordinary skill in the art that other alternatives and modifications can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device, comprising:
  a light-emitting element, comprising a first conductive pad, a second conductive pad, an upper surface, a bottom surface, and a lateral surface arranged between the upper surface and bottom surface;
  a light pervious layer, covering the upper surface and the lateral surface to expose the bottom surface;
  an electrode defining layer, fully arranged under the light pervious layer, and comprising a first recess exposing the first conductive pad, a second recess exposing the second conductive pad and having a different shape from the first recess, and a portion having a curved bottom surface and arranged between the first recess and the second recess;
  a first soldering pad with a melting temperature not greater than 280° C., filled in the first recess in a configuration of directly contacting the first conductive pad and the electrode defining layer residing aside the electrode defining layer, and surrounded by the electrode defining layer; and a second soldering pad, filled in the second recess, and surrounded by the electrode defining layer, wherein the first recess has a first edge, and the second recess has a second edge substantially parallel to the first edge, and the electrode defining layer comprises a first surface and the first soldering pad comprises a second surface, and the first surface is separated from the second surface by a vertical distance of not greater than 10 µm.

2. The light-emitting device according to claim 1, further comprising a gap which is arranged between the first recess and the second recess, and is not greater than 40 µm.

3. The light-emitting device according to claim 1, wherein the first conductive pad and the second conductive pad are disposed on a same side of the light-emitting element.

4. The light-emitting device according to claim 1, wherein the first soldering pad is physically and electrically connected to the first conductive pad, the second soldering pad is physically and electrically connected to the second conductive pad.

5. The light-emitting device according to claim 1, wherein the first soldering pad has a first projected area, and the first conductive pad has a second projected area, and a ratio of the first projected area to the second area is not less than 0.9.

6. The light-emitting device according to claim 1, wherein the light pervious layer comprising a wavelength conversion layer and a light-adjusting layer.

7. The light-emitting device according to claim 1, wherein the light pervious layer includes a wavelength conversion layer and a light-adjusting layer, the light-adjusting layer comprises a plurality of light-diffusing particles.

8. The light-emitting device according to claim 1, wherein the first recess has a shape same as that of the first soldering pad.

9. The light-emitting device according to claim 1, wherein the electrode defining layer comprises a step structure.

10. The light-emitting device according to claim 1, wherein the electrode defining layer comprises a transparent binder and a plurality of light-reflecting particles dispersed in the transparent binder.

11. The light-emitting device according to claim 1, wherein the first soldering pad includes an area expanded outward from the light-emitting element.

12. The light-emitting device according to claim 1, wherein the first soldering pad, the second soldering pad, or both comprise one corner.

13. The light-emitting device according to claim 1, wherein the second soldering pad has a melting temperature not greater than 280° C.

14. The light-emitting device according to claim 1, wherein the first soldering pad comprises a first tin alloy and a second tin alloy, and the first tin alloy has a melting temperature higher than that of the second tin alloy.

15. The light-emitting device according to claim 14, wherein the second tin alloy is closer to the light-emitting element than the first tin alloy.

16. The light-emitting device according to claim 1, wherein the first soldering pad comprises Sn/Sb alloy.

17. The light-emitting device according to claim 1, further comprising a thin metal layer arranged between the electrode defining layer and the first soldering pad.

18. The light-emitting device according to claim 1, wherein the first recess has a plurality of first corners, and the second recess has a plurality of second corners, the first corners and the second corners have different quantities.

* * * * *